United States Patent
Igel

[19]

[11] Patent Number: 5,944,976
[45] Date of Patent: Aug. 31, 1999

[54] PROCESS FOR FORMING ADJACENT MOATS OR HOLES

[75] Inventor: Gunter Igel, Teningen, Germany

[73] Assignee: Micronas Intermetall GmbH, Freiburg, Germany

[21] Appl. No.: 08/784,003

[22] Filed: Jan. 15, 1997

[30]     Foreign Application Priority Data

Jan. 11, 1996 [DE] Germany ............... 196 00 782

[51] Int. Cl.⁶ ...................... C25D 5/02; C25D 5/34
[52] U.S. Cl. ............... 205/221; 205/223; 205/261
[58] Field of Search .................... 205/221, 223, 205/666, 261

[56]     References Cited

U.S. PATENT DOCUMENTS

| | | | |
|---|---|---|---|
| 4,248,683 | 2/1981 | Shaw | 205/666 X |
| 4,268,348 | 5/1981 | Allison et al. | 205/666 X |
| 5,229,682 | 7/1993 | Komatsu . | |

FOREIGN PATENT DOCUMENTS 0296348  12/1988  European Pat. Off. .
0528281  2/1993   European Pat. Off. .
1284532  7/1962   France .

OTHER PUBLICATIONS

Dopant Selective HF Anodic Etching of Silicon for the Realization of Low–Doped Monocrystalline Silicon Microstructures, Nr. Workshop 4, IEEE, Seiten 221–226, Jan. 30, 1991.

Formation Mechanism and Properties of Electrochemically Etched Trenches in N–Type Silicon, J. Electrochem Soc., vol. 137, No. 2, pp. 653–659, Feb. 1990.

*Primary Examiner*—Donald R. Valentine
*Attorney, Agent, or Firm*—Arthur L. Plevy

[57]       ABSTRACT

A process for forming adjacent moats or holes in an electrically non-insulating substrate wherein an electrically insulating masking layer is deposited on the substrate. To form two adjacent moats or holes, the masking layer has an opening whose width is chosen so that it extends over a part of the overall width of the two moats or holes to be formed, and whose shape corresponds to the shape of the moats or holes to be formed. The surface of the masked substrate is then subjected to an anodic oxidation, with the oxidation voltage chosen to be so high that two adjacent moats or holes are formed per opening in the masking layer.

18 Claims, 2 Drawing Sheets

PROCESS FOR FORMING ADJACENT MOATS OR HOLES

FIELD OF THE INVENTION

The present invention relates to a process for forming adjacent moats or holes in an electrically non-insulating substrate using an electrically insulating masking layer which is deposited on the substrate.

BACKGROUND OF THE INVENTION

Processes for forming moats or holes in electrically non-insulating substrates are well known in the art as exemplified in EP 0 296 348. There, adjacent moats or holes are formed in a silicon substrate by electrolytic etching. Such holes or moats in silicon are used in microelectronics and power electronics and thus, processes for forming such structures are becoming increasingly more important in silicon device fabrication. Moreover, recent trends in microelectronics and power electronics, have been to go to greater and greater device densities which necessitates finer device geometries and smaller separations. Accordingly, many chemical etching and plasma etching techniques have been developed and implemented for forming hole or moats patterns.

The disadvantage of such known processes is that the fine device geometries and small separations are difficult to form, especially for adjacently located moats or holes in close proximity to each other. The distance between the adjacently located moats or holes is limited by the photolithographic technique used to form the corresponding openings in the masking layer. More specifically, the minimum mask dimensions that are available for a specific lithographic process substantially determines the minimum size and separation of the moats or holes. With state-of-the-art technology it is problematic, for example, to form moats or holes in semiconductor substrates which are 5 $\mu$s or less apart.

It is, therefore, the object of the present invention to provide an improved process for fabricating two closely spaced moats in an electrically non-insulating substrate.

SUMMARY OF THE INVENTION

A process for forming a pair of adjacent moats in an electrically non-insulating substrate where the pair of adjacent moats have a predetermined combined width and a predetermined shape. The process comprises the steps of depositing an electrically insulating masking layer on a surface of the substrate, forming an opening in the masking layer, and anodically oxidizing the surface of the substrate exposed by the opening at a predetermined oxidation voltage selected to create the pair of adjacent moats in the substrate. The opening of the masking layer has a predetermined width and a predetermined shape. The predetermined width of the opening is selected to extend over a portion of the predetermined combined width of the pair of adjacent moats to be formed in the substrate. The predetermined shape of the opening is selected to correspond to the predetermined shape of the pair of adjacent moats to be formed in the substrate.

Also, an electrically non-insulating substrate comprising a pair of moats made according to the above process, wherein the moats extend into the substrate from a surface thereof; and are separated from each other by a dividing wall.

BRIEF DESCRIPTION OF THE DRAWINGS

The invention will now be explained in detail with reference to the accompanying drawing, in which.

DETAILED DESCRIPTION OF THE INVENTION

The process of the present invention enables the formation of two adjacent moats or holes in a substrate by first employing a masking technique which creates a mask layer on the substrate that has an opening with a width chosen to extend over a portion of the overall width of the two moats or holes to be formed, and a shape which corresponds to the shape of the moats or holes to be formed. After masking, an anodic oxidation technique is carried out at the surface of the masked substrate, with the oxidation voltage chosen to be so high that two adjacent moats or holes are formed per opening in the mask.

Figure 1A:
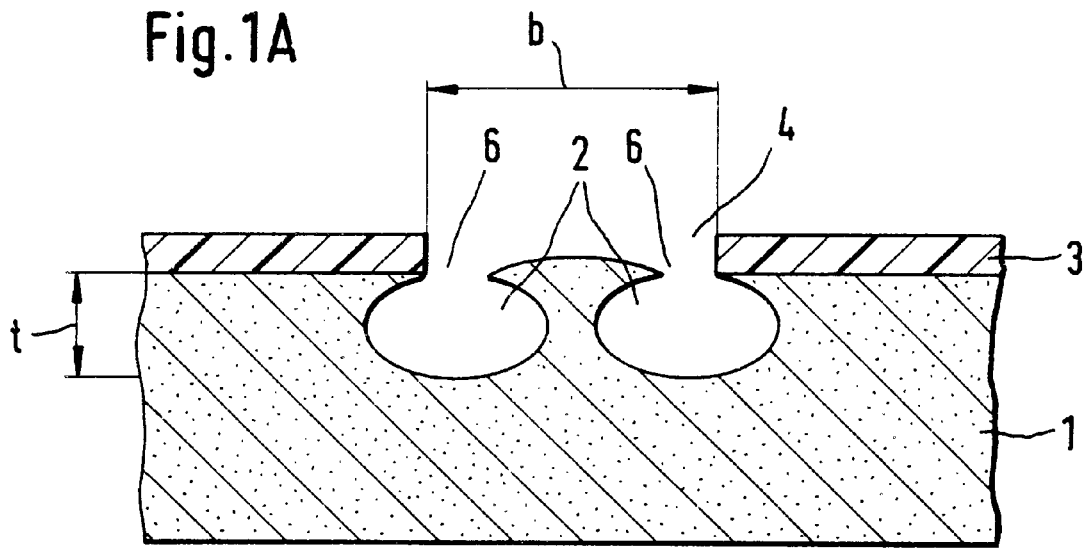
FIG. 1A shows two adjacent moats formed in a substrate by the process according to the invention.

Referring now to FIG. 1A, there is shown a cross section of a portion of a substrate 1 in which two adjacent moats 2 with openings 6, have been formed in accordance with the process of the present invention. As can be seen, a masking layer 3 has been deposited on the substrate and patterned to provide an opening 4 of width b. The moats 2, which have resulted from an anodic oxidation carried out on the masked substrate 1 as described briefly above, extend below the opening 4 of the masking layer 3 and, for a considerable part, also below the masking layer 3. The cross sections of these moats reflect approximately the flux distribution of the electric field during the anodic oxidation. If, in the example shown, the substrate is composed of silicon, the configuration shown can be achieved with a masking layer whose opening and width are between 10 and 15 $\mu$m.

As will be explained later on in greater detail, the thickness of the masking layer 3 is chosen so that, taking into account the material thereof, the masking layer 3 has a dielectric strength which preserves the thickness of the masking layer during oxidation at the oxidation voltage of the anodic oxidation. The depth t of the moats 2 is determined by the oxidation time. At a desired depth t of the moats 2, the oxidation is terminated.

Figure 1B:
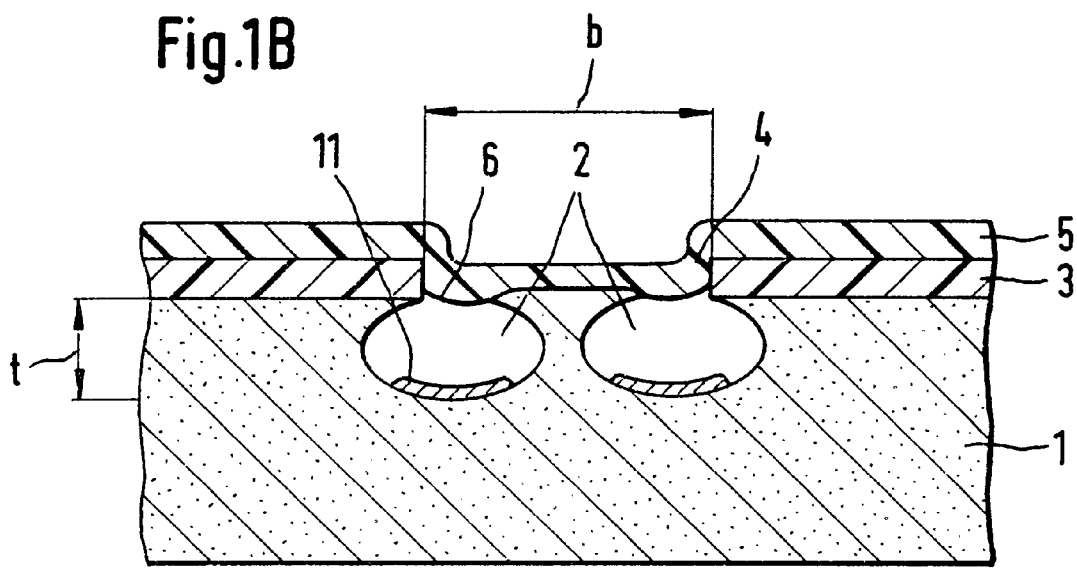
FIG. 1B shows the substrate of FIG. 1A with the moats closed toward the substrate surface in accordance with the present invention.

In FIG. 1B, a capping layer 5 has been deposited on the masked substrate 1 with the moats 2, and closes the openings 6 of the moats 2 at the surface of the substrate 1. The capping layer 5 can be any suitable well known material which is capable of being deposited by either a directional, spatially anisotropic process, such as sputtering or a non-directional process, such as vapor deposition. Since the openings 6 are small compared to the cross sections of the moats 2, they can be easily and reliably closed with the capping layer 5 in a very simple manner. This makes it possible, for example, to pass a cooling liquid through the moats 2 which cannot leak from the latter. The process according to the invention makes it possible to arrange two moats side by side and connect them with one another at one end, so that the moats 2 can be used as a forward channel and a return channel for a cooling liquid. To do this, it suffices in principle to form two adjacent moats. Further, in embodiments of the invention where the moats 2 are used for a cooling liquid, a metal layer can be applied to the walls of the moats or holes as will be described further on in greater detail. This is advantageous since metal has a good thermal conductivity, and thus, makes the surfaces of the moats better suited for dissipating heat. It is also possible to form moats in which the closing layer is opened again, so that a liquid flowing through the moats can escape through the surface of the substrate in a direction perpendicular to the direction of the flow. A possible application is an ink jet printer, for example. The capping layer 5 can advantageously be deposited on the masked substrate, so that no additional process steps are necessary.

As will be described later on, in other embodiments of the present invention, a layer of material can be deposited on the walls of the moats or holes to make them reflective. This is particularly advantageous if optical fibers are to be placed into the moats, because better light conduction is then achieved.

Still referring to FIG. 1B, at the bottom of each of the moats 2 is a layer 11 which was formed during the deposition of the capping layer 5. In the example shown, the layer 11 was deposited by a directional, spatially anisotropic process, such as sputtering. If a nondirectional process, such as a vapor deposition process, is used to deposit the capping layer 5, the walls of the moats 2 can also be covered with such a layer. The material and the method of deposition can be chosen depending on the application.

After the anodic oxidation, the substrate surface shown in FIG. 1A can be optionally subjected to a thermal oxidation in which the moats 2 are closed, wholly or in part, at the substrate surface. Through the formation of $SiO_2$, the cavities in the moats 2, and thus the opening at the substrate surface, become smaller. Whether a capping layer is additionally deposited on the substrate surface and to what extent the openings at the substrate surface are closed by oxidation has to be decided for the respective application by the person skilled in the art.

Figure 2:
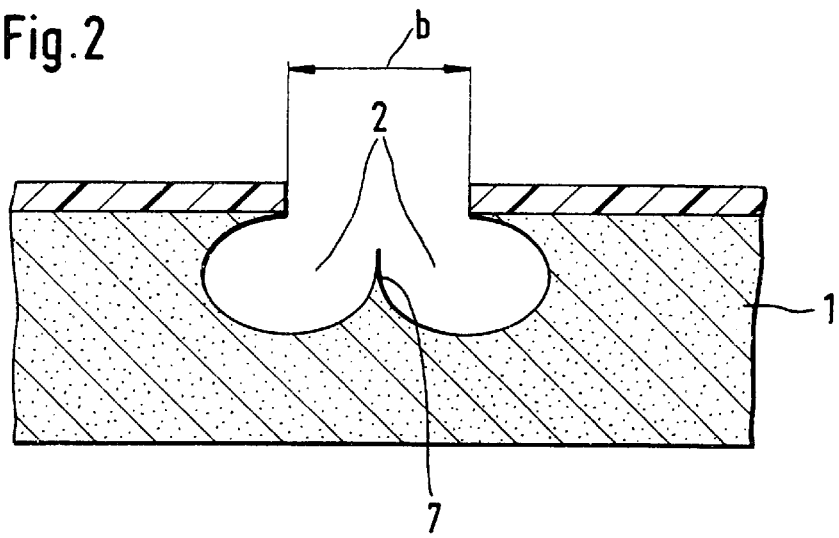
FIG. 2 shows two adjacent moats formed in a substrate by the process according to the invention for which a masking layer with an opening narrower than that in FIG. 1 was used.

FIG. 2 shows a cross section of a substrate 1 which also has two adjacent moats 2. The masking layer 3 on the substrate 1 has an opening 4 whose width is less than that shown in FIG. 1. The moats 2 were formed by anodic oxidation under the same conditions as in FIG. 1 except that the opening 4 of the masking layer 3 has a smaller width b. Because of the smaller width b of the opening 4, a spike-shaped dividing wall 7 is reduced below the level of the substrate surface. In a silicon substrate, for example, this can be achieved with a masking layer in which the width of the opening is approximately 7 $\mu$m. In this manner, the silicon spike can be formed between the moats 2. Depending on the application of such a silicon spike, an oxide layer (created by thermal oxidation) may be removed from a given area of the spike or, the silicon spike can also be metallized by depositing a metal layer as will described shortly below. Possible applications of such a spike-shaped dividing wall are, for example, cathodes for mini-tubes capable of emitting cold electrons, tips of tunneling microscopes, and the like. Since the moats formed by the process according to the invention have a cross section which is substantially greater than the width of the mask opening, they also extend into a region below the masking layer. Consequently, the width of the opening can be used as a shield during the deposition of the metal, so that only the area around the spike-shaped dividing wall is metallized while an insulating layer is left in the remaining area.

Preferably, the oxidation time is chosen so that the dividing wall 7 is lower than the level of the substrate surface. In that case, the oxidation time must be lengthened until a predetermined distance is achieved between the peak of the dividing wall 7 and the level of the substrate surface. This is desirable if the silicon spike is used as a cathode for electron emission. Then the anode can be provided above the opening on the substrate surface or the masking layer. The distance between the cathode and the opening in the overhanging substrate or the masking layer can then be adjusted so that the electrons can be focused into the anode in a suitable manner.

Figure 3:
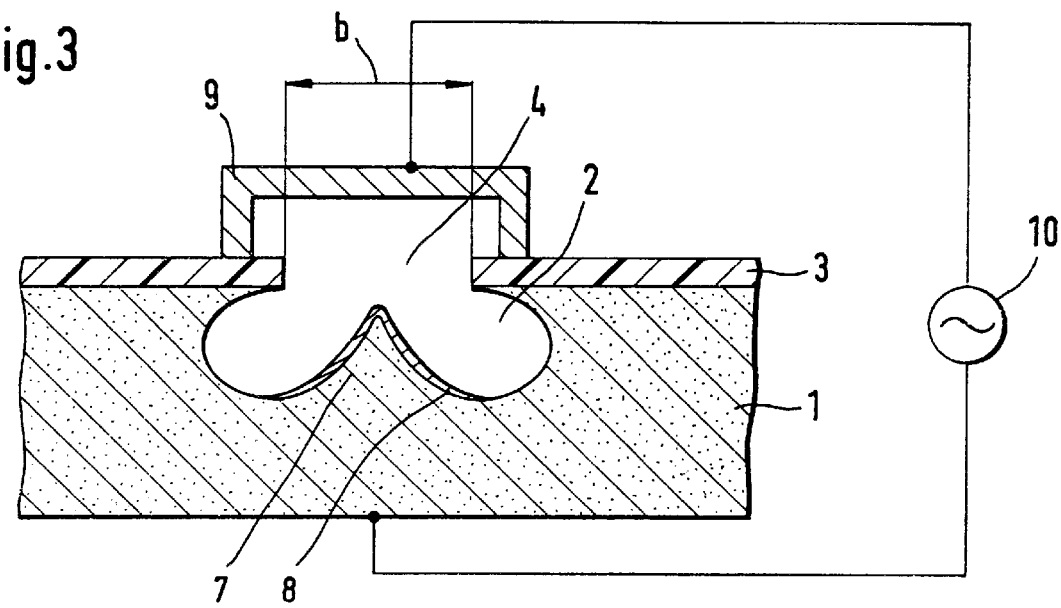
FIG. 3 shows a structure formed by the process according to the invention which comprises an electron-emitting cathode.

FIG. 3 also shows a structure produced by the process according to the invention. The moats 2 were formed under the same conditions as FIG. 2. A metal layer 8 is additionally deposited by directional sputtering for example, on the spike-shaped dividing wall 7 using the masking layer 3. The tip of the dividing wall 7 is thus metallized and the remaining walls of the moats 2 isolate the metal layer 8 from the surface of the substrate 1. In this embodiment, the metallized dividing wall 7 serves as a cathode from which electrons can be emitted. Above the opening 4 in the masking layer 3, an anode 9 of metal is provided. By applying a suitable voltage from a voltage source 10 to the metal layer 8 and the anode 9, the electrons emitted from the metal layer 8 can be suitably accelerated and focused by the anode 9.

In the following, the process according to the invention is described by referring again to the embodiment of FIGS. 1A and 1B. In FIG. 1A, the masking layer 3 has been deposited on the substrate and an opening 4 of width b is formed in this layer using photolithography or any other suitable method. Next, an anodic oxidation is carried out on the masked substrate 1. To this end, a conductive, oxygen-containing liquid is customarily applied to the masked substrate 1. If the substrate is a semiconductor wafer, the liquid may be held, for example, in a sealing ring placed around the wafer. The oxidation voltage is applied to the substrate 1 and to an electrode immersed in the liquid. The oxidation is carried out for a predetermined time. During this oxidation the adjacent moats 2 are formed. The oxidation is ended when the moats 2 have reached a predetermined depth t. After termination of the oxidation and removal of the oxidation liquid, a capping layer 5 is deposited on the surface of the masked substrate 1 as shown in FIG. 1B. The capping layer 5 covers the openings 6, so that the moats are closed towards the surface of the substrate 1. Together with the capping layer 5, the layer 11 is formed. The oxidation voltage is at least one order of magnitude greater than during conventional anodic oxidation. If the substrate 1 is a semiconductor substrate, an oxidation voltage of at least 100 V is used.

The process for forming two adjacent moats or holes in accordance with the present invention has the advantage that only one opening needs to be provided in the masking layer. If the oxidation voltage for carrying out the anodic oxidation is chosen to be high enough, two adjacent moats or holes will form below the opening in the masking layer during the oxidation process. This surprising effect seems to be due to the fact that because of the high voltage, the oxide layer formed during the oxidation process is breached. While the oxidation process continues, the two adjacent moats or holes are formed. The shape is determined by the flux distribution of the electric field caused by the oxidation voltage. The formation of the moats or holes begins at the edge of the opening in the masking layer, where the field strength is greatest. The distance between the two moats or holes is determined by the width of the opening in the masking layer. With a wider opening, the distance between the two moats or holes is greater. The shape of the holes or moats in the direction perpendicular to the width of the opening is determined by the shape of the opening in the direction perpendicular to the width. For example, with an opening in the form of a long rectangle, two parallel, straight channels are formed. The course of the channels is determined by the course of the opening. The process according to the invention makes it possible to form closely spaced moats or holes, since only one mask opening is required for two adjacent moats or holes, so that the limitation of the width of the opening by the photolithographic process used is divided between two adjacent moats.

Preferably, the dielectric strength of the masking layer with respect to the oxidation voltage is chosen so that oxidation below the masking layer is prevented. The dielectric strength is determined by the thickness and the material of the masking layer. Advantageously, the oxidation voltage is at least one order of magnitude higher during ordinary anodic oxidation. In this range, the best results are achieved. In the case of semiconductors, the oxidation voltage during conventional anodic oxidation ranges between approximately 1 and 10 V; in the process according to the invention, the oxidation voltage is approximately 100 V or more.

Advantageously, the oxidation time of the anodic oxidation is chose so that a predetermined depth of the adjacent moats is produced. The dependence of the depth on the oxidation time can be determined in preliminary tests for a predetermined width and a predetermined shape of the mask opening. By fixing the oxidation time, a predetermined shape and depth of the moats or holes is then achieved in a reliable manner.

It should be understood that the embodiment described herein is merely exemplary and that a person skilled in the art may make many variations and modifications to the embodiments utilizing functionally equivalent elements to those described herein. Any and all such variations or modifications as well as others which may become apparent to those skilled in the art, are intended to be included within the scope of the invention as defined by the appended claims.

What is claimed is:

1. A process for forming a pair of adjacent moats in an electrically non-insulating substrate, said pair of adjacent moats having a predetermined combined width and a predetermined shape, said process comprising the steps of:

depositing an electrically insulating masking layer on a surface of said substrate;

forming an opening in said masking layer, said opening having a predetermined width and a predetermined shape, said predetermined width of said opening selected to extend over a portion of said predetermined combined width of said pair of adjacent moats to be formed in said substrate, and said predetermined shape of said opening selected to correspond to said predetermined shape of said pair of adjacent moats to be formed in said substrate; and anodically oxidizing said surface of said substrate exposed by said opening at a predetermined oxidation voltage selected to create said pair of adjacent moats in said substrate.

2. The process according to claim 1, wherein said pair of adjacent moats comprises a plurality of moat pairs and further comprising the step of selecting said predetermined oxidation voltage to create one pair of said moat pairs per each of said openings in said masking layer.

3. The process according to claim 1, further comprising the step of selecting a material for said masking layer which has a dielectric strength which, in respect to said predetermined oxidation voltage, so that oxidation below said masking layer is prevented.

4. The process according to claim 1, further comprising the step of selecting said predetermined oxidation voltage to be at least one order of magnitude higher than the oxidation voltage of a conventional anodic oxidation.

5. The process according to claim 1, wherein said substrate comprises a semiconductor substrate and further comprising the step of selecting said predetermined oxidation voltage to be at least 100 volts.

6. The process according to claim 1, wherein said step of anodically oxidizing is performed for a predetermined time period selected so that said pair of adjacent moats created in said substrate is of a predetermined depth.

7. The process according to claim 1, further comprising the step of selecting said predetermined width of said opening in said masking layer to produce a spike-shaped dividing wall between said pair of adjacent moats.

8. The process according to claim 1, wherein each moat of said pair of adjacent moats formed in said substrate has a wall and further comprising the step of applying a metal layer to said wall of each of said moats.

9. The process according to claim 1, further comprising the step of thermally oxidizing said surface of said substrate after said step of anodically oxidizing, to at least partially close each moat of said pair of adjacent moats at said surface thereof.

10. A process for forming a pair of moats in an electrically non-insulating substrate, said pair of moats having a predetermined combined width, said process comprising the steps of:

depositing a masking layer on a surface of said substrate;

forming an opening in said masking layer, said opening having a predetermined width selected to extend over a portion of said predetermined combined width of said pair of moats to be formed in said substrate; and anodically oxidizing said surface of said substrate exposed by said opening at a predetermined oxidation voltage selected to create said pair of moats in said substrate.

11. The process as claimed in claim 10, further comprising the step of depositing a capping layer over said substrate to close off each moat of said pair of moats.

12. The process according to claim 11, further comprising the step of depositing said capping layer on said masking layer of said substrate.

13. The process according to claim 10, further comprising the step of thermally oxidizing said surface of said substrate after said step of anodically oxidizing, to at least partially close each moat of said pair of moats at said surface thereof.

14. The process according to claim 10, wherein said step of anodically oxidizing is performed for a predetermined time period and wherein said predetermined width of said opening in said masking layer and said predetermined time period are selected to produce a spike-shaped dividing wall between each moat of said pair of moats.

15. A process for forming a pair of adjacent moats in an electrically non-insulating substrate, said pair of adjacent moats having a predetermined combined width and a predetermined shape, said process comprising the steps of:

depositing an electrically insulating masking layer on a surface of said substrate;

forming an opening in said masking layer, said opening having a predetermined width and a predetermined shape, said predetermined width of said opening selected to extend over a portion of said predetermined combined width of said pair of adjacent moats to be formed in said substrate, and said predetermined shape of said opening selected to correspond to said predetermined shape of said pair of adjacent moats to be formed in said substrate; and anodically oxidizing said surface of said substrate exposed by said opening at a predetermined oxidation voltage selected to create said pair of adjacent moats in said substrate;

wherein said step of anodically oxidizing is performed for a predetermined time period selected to create a dividing wall between said pair of adjacent moats in said substrate, said wall being lower than said surface of said substrate.

16. A process for forming a pair of adjacent moats in an electrically non-insulating substrate, said pair of adjacent moats having a predetermined combined width and a predetermined shape, said process comprising the steps of:

depositing an electrically insulating masking layer on a surface of said substrate;

forming an opening in said masking layer, said opening having a predetermined width and a predetermined shape, said predetermined width of said opening selected to extend over a portion of said predetermined combined width of said pair of adjacent moats to be formed in said substrate, and said predetermined shape of said opening selected to correspond to predetermined shape of said pair of adjacent moats to be formed in said substrate;

anodically oxidizing said surface of said substrate exposed by said opening at a predetermined oxidation voltage selected to create said pair of adjacent moats in said substrate; and, depositing a capping layer over said substrate to close off each moat of said pair of adjacent moats.

17. The process according to claim 14, further comprising the step of depositing said capping layer on said masking layer of said substrate.

18. A process for forming a pair of moats in an electrically non-insulating substrate, said pair of moats having a predetermined combined width, said process comprising the steps of:

depositing a masking layer on a surface of said substrate;

forming an opening in said masking layer, said opening having a predetermined width selected to extend over a portion of said predetermined combined width of said pair of moats to be formed in said substrate;

anodically oxidizing said surface of said substrate exposed by said opening at a predetermined oxidation voltage selected to create said pair of moats in said substrate; and, applying a metal layer in each moat of said pair of moats.

* * * * *